United States Patent [19]

Shepard

[11] 4,035,833
[45] July 12, 1977

[54] METHOD AND APPARATUS FOR ADJUSTING THE OUTPUT FREQUENCY OF A FREQUENCY SOURCE TO A VERY HIGH DEGREE OF PRECISION

[75] Inventor: Leonard F. Shepard, Dover, Del.

[73] Assignee: ILC Data Device Corporation, Bohemia, N.Y.

[21] Appl. No.: 636,813

[22] Filed: Dec. 1, 1975

[51] Int. Cl.² .................................... H04N 9/62
[52] U.S. Cl. ........................... 358/10; 325/363; 331/1 R; 331/44
[58] Field of Search .......... 358/1, 10, 17, 28, 35; 325/58, 363; 331/44, 1 R, 18

[56] References Cited

U.S. PATENT DOCUMENTS 3,958,269   5/1976   Davis ............................ 358/10

OTHER PUBLICATIONS

Communications pp. 8-12, 15-16, Oct. 1975.
Communications p. 41 Nov. 1975.

Primary Examiner—Robert L. Richardson
Attorney, Agent, or Firm—Ostrolenk, Faber, Gerb & Soffen

[57] ABSTRACT

Method and apparatus for comparing and/or adjusting the frequency output of a frequency source, which method and apparatus is greatly simplified, and permits adjustment within a relatively short time interval and at a precision whose known difference is less than five parts in the $10^{12}$.

The rubidium-controlled oscillator employed by the major networks to produce the 3.58 MHz subcarrier signal is utilized as a standard. Offsets made available at regular intervals by the National Bureau of Standards are utilized to indicate the frequency differences between the network standards and the United States Frequency Standard (USFS). The method employs two phase locked loops each having divide by N dividers to electronically perform the mathematical operations represented by the formula $$\frac{x+1}{x} \cdot \frac{x-1}{x} = \frac{x^2-1}{x^2}$$

whereby the division ratios for satisfying the values of the appropriate $x$, $x+1$, and $x-1$ terms of the equation are appropriately adjusted to obtain an offset which approximates the published offset with the known difference of less than five parts in $10^{12}$.

The technique may be employed to adjust a local generator by offsetting its value so as to bring it into phase synchronism with a network standard or, alternatively, the network standard may be adjusted by the offset to the United States frequency standard and then compared with the local oscillator, thus removing almost all of the offset value to thereby bring the frequency of the calibrated oscillator to a value extremely close to the standard where the difference is smaller than that obtainable in any conventional method.

Alternatively, the method and apparatus of the present invention permits the use of the oscillator in a standard color television receiver as a high precision frequency source for use in scientific, laboratory, industrial and other applications. Also, primary (i.e. cesium) standards may be offset by use of the electronic offset described herein arranged in multiple unit cascaded fashion.

24 Claims, 6 Drawing Figures

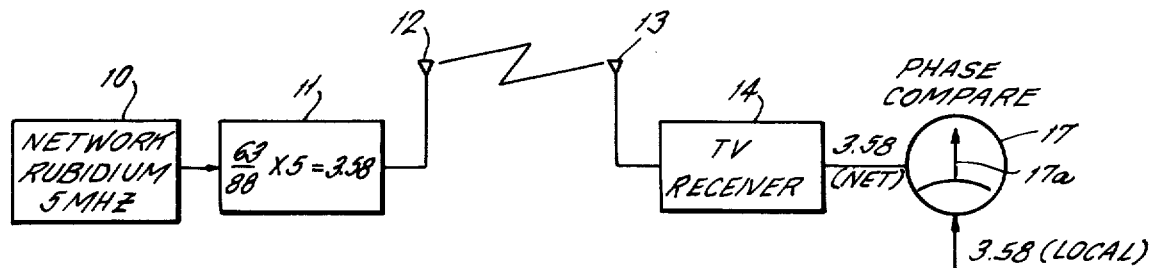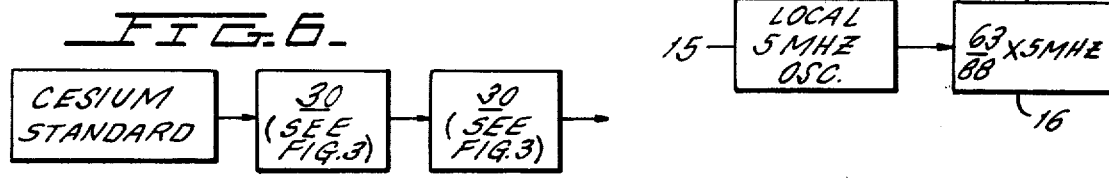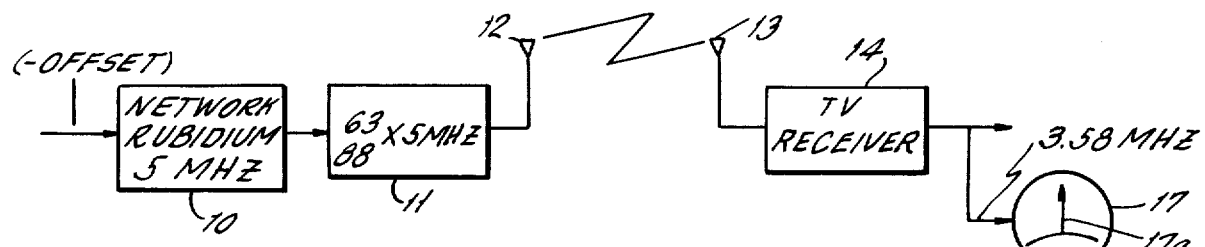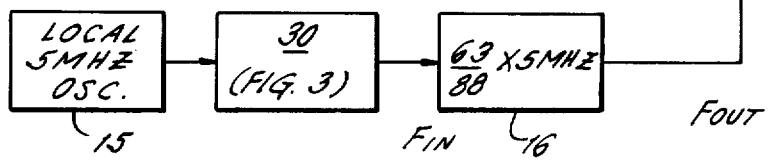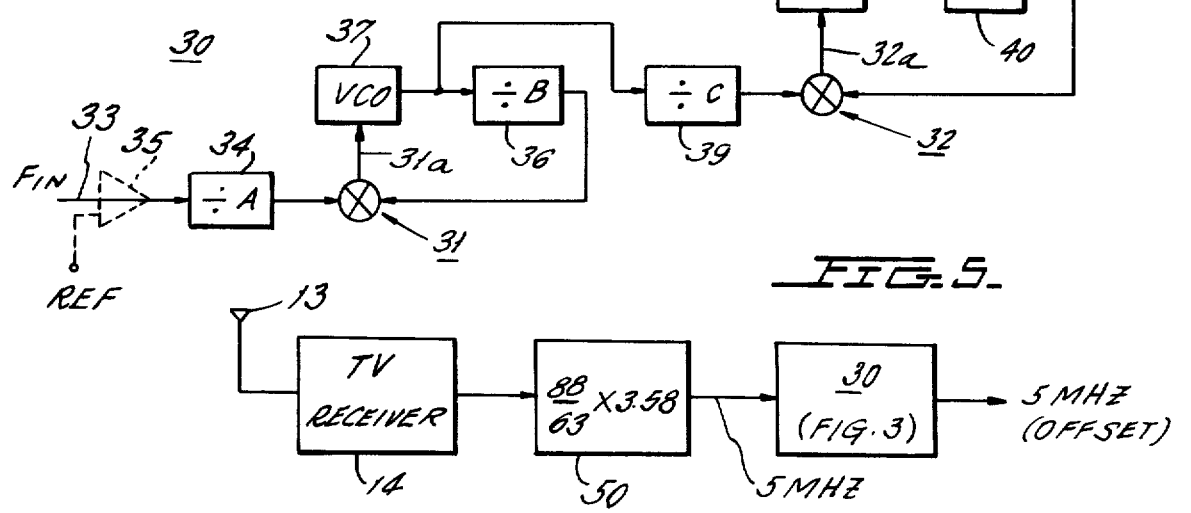

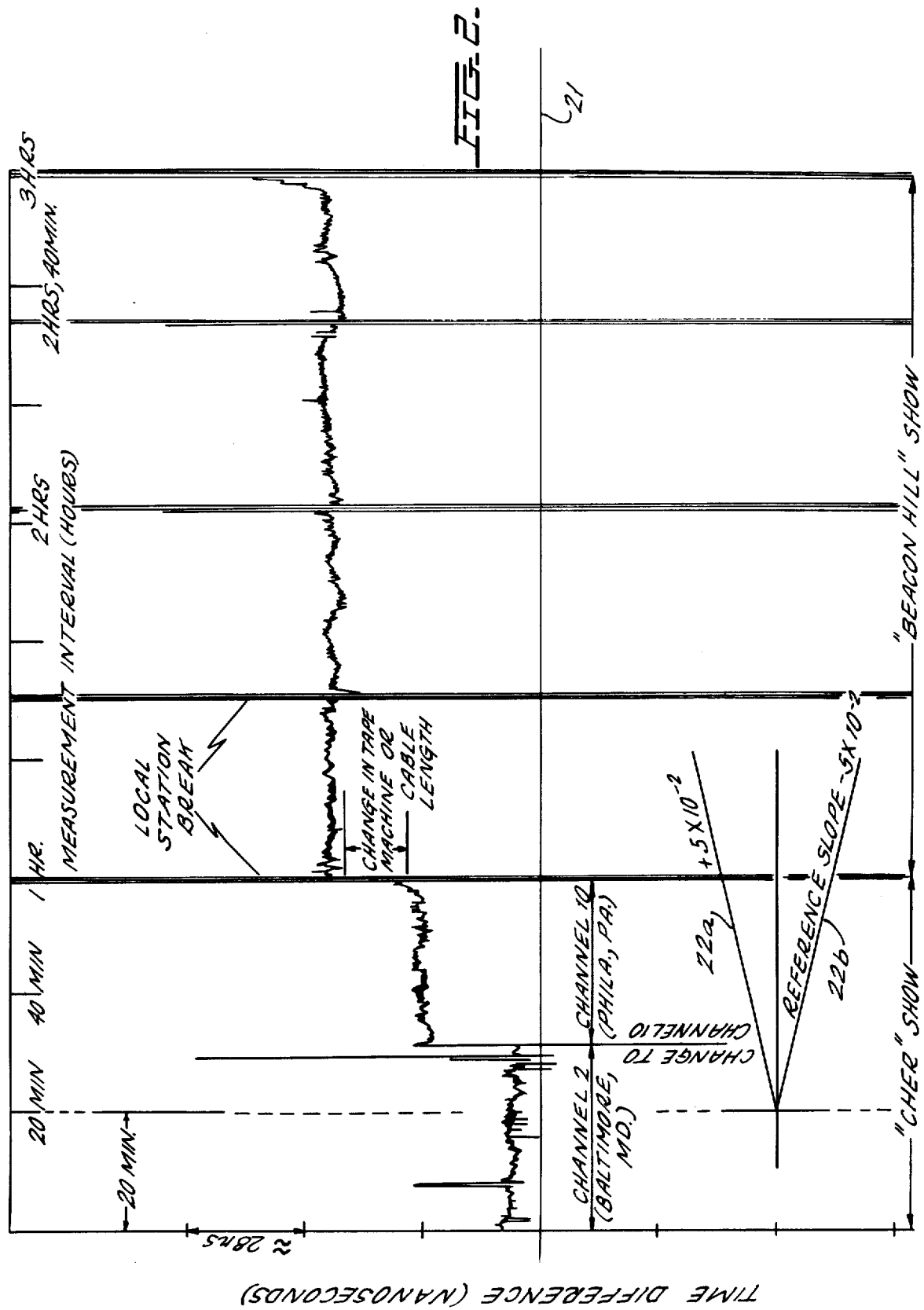

METHOD AND APPARATUS FOR ADJUSTING THE OUTPUT FREQUENCY OF A FREQUENCY SOURCE TO A VERY HIGH DEGREE OF PRECISION

BACKGROUND OF THE INVENTION

The present invention relates to adjustment of frequency standards and more particularly to a novel method and apparatus for adjusting local frequency sources to a precision not heretofore attainable through the use of network subcarrier sources and offset information regularly published by the National Bureau of Standards (NBS).

A large number of applications in fields such as television transmission, space communications, radar, satellite tracking, as well as other scientific and industrial applications typically require frequency sources having a high degree of stability and precision. Many applications require both short term and long term stability and the presence of these capabilities in a single frequency source is not easily obtainable. Short term stability is typically considered as that interval of time required to make a measurement, which interval is typically in the range from a fraction of a second to a few seconds.

The major television networks of the United States have adopted atomic oscillators for generating color reference signals, which oscillators are typically of the rubidum-vapor or rubidum gas-cell standards which are utilized to produce the necessary color signal at a frequency of 3.58 ... MHz, also typically referred to as the color subcarrier signal. Such frequency sources are characterized as "secondary" sources, the primary sources, for example, being the cesium type atomic clocks regularly maintained by the National Bureau of Standards, such clocks being categorized as "primary" standards.

The rubidium type frequency standards, while having excellent short term stability, are nevertheless subjected to drift and the output frequency of the standard is regularly monitored by NBS for purposes of comparing the network rubidium frequency standards against the rate of the NBS atomic time scale. The drift results in frequency offset values are periodically published, whereby the offset values represent the frequency offset or difference between the atomic time scale or U.S.F.S. (United States Frequency Standard) and the network rubidium standards to permit adjustment and thereby correct for such drift.

It is thus possible to utilize a standard color receiver as a high precision frequency reference.

The rubidium frequency standards were adopted by the major television networks and these standards were originally referenced to the U.T.C. offset of $300 \times 10^{-10}$ with respect to the defined atomic frequency standards. The oscillators employed by the networks have nominal 5 MHz output frequencies, with an approximate $-300 \times 10^{-10}$ offset and are modified by the use of frequency synthesizers to generate the subcarrier signal of 3.58 MHz (approximately), the aforesaid subcarrier frequency being synthesized by taking $63/88 \times$ 5 MHz.

This frequency standard, together with the offsets regularly published by NBS is typically utilized as a calibrating signal for very accurately setting local oscillators.

The standard technique for calibrating a local 5 MHz oscillator is to couple the output of the local oscillator through a frequency synthesizer to generate the subcarrier frequency signal. The color receiver which locally generates the 3.58 MHz signal is then typically compared in either a phase comparator in the form of a phase meter or through the employment of a chart recorder. For example, if the phase meter provides a zero reading (i.e., a zero pointer deflection) or at a constant non-zero reading this indicates that the two signals are operating at the same frequency. Although this represents the ideal situation, as a practical matter, the phase meter, as exemplified by the chart recorder, does not plot a straight line. In fact, the plot deviates quite significantly from a straight line as a result of instabilities in the propagation path due to both small and large phase jumps, changes in network path length and changeovers from network transmission to local station transmission.

Ideally, comparisons and calibrations should be performed during those times in which the networks are presenting "live" programming which presently is typically of the order of 14 hours per day. The phase recording measurement interval comparing the color subcarrier signal of the color receiver with the local oscillator, must be maintained for a period of the order of 15 minutes in order to obtain adequate resolution so that the error is of the order of one part in $10^{10}$. For measurement times shorter than 15 minutes, the resolution is reduced substantially in proportion to the reduction in measurement time. Other techniques which have been developed such as, for example, the TV color bar comparator system and the frequency measurement computer (both developed by the National Bureau of Standards) respectively provide calibration accuracy to the extent that the errors are one part in $10^{10}$ and one part in $10^{11}$ over measurement times of the order of minutes.

BRIEF DESCRIPTION OF THE INVENTION

The present invention is characterized by providing a method and apparatus for performing the aforesaid calibrations and comparisons over measurement periods at least comparable to or shorter than measurement intervals presently required in the use of existing techniques and being further characterized by providing a much higher degree of accuracy such that the known difference between the offset generated by the present invention differs from the published offset delay by no greater than five parts in $10^{12}$.

The theory of operation of the present invention takes advantage of the simple and yet powerful mathematical relationship:

$$\frac{x+1}{x} \times \frac{x-1}{x} = \frac{x^2-1}{x^2} \tag{1}$$

to electronically create an offset which can be generated in either the positive or negative direction in order to adjust a received subcarrier within a known offset of less than five parts in $10^{-12}$ of the United States Frequency Standard (USFS) by making reference to the NBS published offsets.

Electronic means are utilized to perform the mathematical operations set forth by Equation (1) and said circuitry incorporates divide by N dividers manually adjustable to obtain the desired division ratios in order to generate an offset which very closely approximates the published offset. Once the desired offset is set into the circuitry, the regenerated subcarrier from the color receiver can then be offset to substantially agree with the USFS and then utilized to calibrate local oscillators at various standard frequencies. The calibration of an oscillator is made only after the regenerated subcarrier is electronically offset to remarkably increase the measurement accuracy of the calibration. The electronically generated offset differs by an extremely small and known amount so that the measurement difference between the subcarrier (after being electronically offset) and oscillator being calibrated is quite small when compared against known techniques. Accuracy and precision in measurement is limited only by the accuracy of the NBS measurements as manifested in the NBS published offsets.

An an alternative method, the frequency of the oscillator may be electronically offset and then calibrated by comparison with a regenerated subcarrier with a regenerated subcarrier, leading to the same high degree of precision and accuracy described in the previous paragraph. The system provides a frequency source with an overall accuracy of $\pm 1 \times 10^{-11}$ being limited primarily by the published offset data with the developed frequency being directly traceable to the NBS atomic standards. Alternatively, a local oscillator or oscillators may be adjusted using the offset regenerated subcarrier as the standard for control, comparison and calibrated purposes. Primary standards (i.e. cesium) may also be electronically offset through the technique and apparatus of the present invention.

It is therefore one object of the present invention to provide a simple and yet powerful method and apparatus for electronically generating frequency offsets whose precision is so great as to compare with NBS published offsets with an error of less than one part in $10^{11}$.

BRIEF DESCRIPTION OF THE FIGURES

The above as well as other objects will become apparent when reading the accompanying description and drawings in which:

FIG. 1 is a simplified block diagram representing a conventional scheme for calibrating a local oscillator.

FIG. 2 shows a phase type recording of the two signals being compared using the scheme of FIG. 1 and which is useful in showing the typical phase instabilities encountered in developing such measurements.

FIG. 3 shows a block diagram of the system employed in obtaining an offset of high precision in accordance with the formula and principles of the present invention.

FIGS. 4, 5 and 6 are block diagrams showing the applications of the offset technique of the present invention.

DETAILED DESCRIPTION OF THE INVENTION

FIG. 1 shows one simplified technique for calibrating a 5 MHz oscillator so that it agrees with the 5 MHz rubidium type frequency standard employed by one of the major television networks (i.e. ABC, CBS, NBC or PBS).

The network rubidium standard 10, shown in FIG. 1, and originally referenced to the UTC offset which is nominally $300 \times 10^{-10}$ with respect to the defined atomic frequency standard, is a 5 MHz utilized in conjunction with a synthesizer 11 to generate a frequency of 3.5795454545 A... MHz ("rounded off" to 3.58 MHz). The 3.58 MHz signal is electronically synthesized by multiplying the 5 MHz output 10a by the fraction 63/88.

These rubidium type standards continue to experience a certain amount of drift and are measured on a regular basis by NBS to compare the rubidium standards against the United States Frequency Standard (USFS). Based on these measurements, NBS publishes on a regular basis average fractional frequency offset values in parts to $10^{11}$. The color subcarrier of 3.58 ... MHz utilized to phase lock the color subcarrier during network programming, may be measured with a precision of a few parts in $10^{11}$ by using a color television receiver and measurement and frequency synthesizer equipment of the type shown in FIG. 1. The received signal should preferably have a signal strength which is adequate for developing a color picture of reasonable quality from one of the "live" network programs broadcast by the major networks of the United States.

Let it be assumed that it is desired to calibrate the 5 MHz oscillator 15 so that it agrees with the network rubidium type standard 10. The color subcarrier generated by synthesizer 11 is transmitted, as represented by the transmission antenna 12 and is received by the user's antenna 13 and applied to receiver 14. The regenerated color subcarrier from receiver 14 is applied to one input of phase comparator 17. The local oscillator 15 to be calibrated has its output applied to a frequency synthesizer 16 which, in turn, has its output coupled to the remaining input of phase comparator 17.

The scheme of FIG. 1 presupposes that the rubidium standard 10 has already been adjusted by the appropriate frequency offset. The phase comparator 17 may incorporate either a phase meter or a chart recorder. If the meter needle 17a undergoes zero deflection, or if the chart recorder draws a straight line indicating a fixed phase between the two signals and applied to comparator 17, it therefore follows that the two oscillators (i.e., receiver 14 and local oscillator 15) are operating at the same frequency. As a practical matter, the chart recorder plot is not a straight line and, due to instabilities in the propagation path between the network transmitter and the remote receiver 14, small and/or large jumps in phase will be seen to occur and the oscillators themselves will be found to impose some ultimate limitation on the overall straightness of the line representing phase difference.

Even assuming the local oscillator 15 were perfectly matched with the network rubidium standard 10 so that the only instabilities were those introduced by the network path, a phase (i.e. time difference) recording of the two compared signals will result in the recording as shown in FIG. 2.

The recording of FIG. 2 serves to indicate the four basic types of phase instability experienced in the development of such measurements, namely small and large phase jumps, network path length changes, and local station originations, all of which instabilities tend to limit the precision of the phase measurement and hence the precision to which the frequency of local oscillator 15 can be compared to the network color subcarrier. The recording in FIG. 2 was taken during the three hour broadcast of the "Cher" and "Beacon-Hill" ("live") shows by CBS.

Line 21 represents the ideal phase plate which is indicated as showing a zero constant phase difference between the two compared signals. In most cases, and using the technique of FIG. 1, resolution is limited to about 10 nanoseconds in 15 minutes, thus providing a resolution of the order of $1.1 \times ^{11}$. Lines 22a and 22b respectively show reference slopes of $+5 \times 10^{-12}$ seconds.

For measurement times shorter than 15 minutes, measurement resolution reduces roughly in proportion to the reduction in length of the measurement interval.

The large phase jumps shown in FIG. 2 are typically due to changes in the operating activity of the network and are due, for example, to changes resulting from the switching from one video tape machine or camera to another wherein varying lengths of connecting cable are switched into or out of the switching path. Many of the large phase jumps are also coincident with changes occuring when a live program is switched to present a commerical and back again.

The small phase jumps are due to phase distortion in the microwave systems utilized to carry the network programs and also to multipath phenomenon existing between the local station transmitter and the receiver 14. The phase distortion within the TV receiver is also known to contribute to the small phase jumps. Since the objective is to obtain an average measurement over a time interval of sufficient length the small and large phase jumps do not degrade the calibration operation.

During local station breaks, the received color subcarrier originates from the local station's oscillator. Since very few local stations are equipped with rubidium type frequency standards, their stability is quite poor as compared with the network rubidium type standards, and is found to cause changes in phase of 360° about once per second. This occurrence is shown as occurring approximately every half-hour during the total measurement period shown in FIG. 2. During such time no precision measurements can be obtained. Many stations record network programming for rebroadcast at a later date. Upon rebroadcast the color subcarrier frequency is referenced to the local stations' color frequency oscillator also affecting the ability of using the color receiver 14 as a precision reference.

As was pointed out, the rubidium standards of the major broadcasting networks are "offset" from the U.S.F.S. by a frequency offset (nominally) of the order of $-300 \times 10^{-10}$. The exact offset is measured periodically by NBS and is published in a monthly NBS Time Frequency Services Bulletin, the actual values for the offset differing from the original offset of $300 \times 10^{-10}$ relative to the atomic frequency standards as a result of the "drift" experienced by such rubidium type standards.

For example, the average fractional frequency offset published for the week of Aug. 4–8, 1975 for the three commercial networks was:

NBC: $-301.64 \times 10^{-10}$
CBS: $-296.24 \times 10^{-10}$
ABC: $-300.88 \times 10^{-10}$ The "−" sign preceding the offset indicates that the network frequency is low compared to the NBS atomic frequency standard. Conversely a "+" symbol would represent an offset for a network frequency which is high compared with the NBS atomic frequency standard.

Assuming an offset of $-300 \times 10^{-10}$ occurring between the frequency sources 14 and 15 and assuming the time lag to be the period of one cycle of the 3.58 . . . MHz frequency, the time of one cycle of the beat note between the two sources is equal to:

$$T = \Delta t / \text{Offset}$$

where
$\Delta t = 1/(3.57954 \times 10^6)$
$\Delta t = 0.27936 \times 10^{-6}$
Therefore $$T = \frac{279.36 \times 10^{-9}}{\text{Offset}} = \frac{279.36 \times 10^{-9}}{300.00 \times 10^{-10}}$$

$T = 9.31$ seconds

Thus, in accordance with the above example, and assuming the offset to be exactly $-300 \times 10^{-10}$, the color subcarrier from receiver 14 would lose one cycle with respect to a zero offset oscillator 15 (i.e., an oscillator operating at exactly 3.58 MHz) every 9.31 seconds.

Using the TV color bar technique as one method of implementing the beat note period measurement, the error resolution is of the order of one part in $10^{10}$. Using the NBS frequency measurement computer in the performance of the beat method, the resolution provides an error of over two parts in $10^{11}$. Using the technique of the present invention, as will be described in detail hereinbelow, the offset difference is less than five parts in $10^{12}$ which is less than one-fourth the error encountered in the frequency measurement computer technique.

As was set forth hereinabove, an offset is electronically generated in accordance with the circuitry of FIG. 3 in order to adjust the received color frequency subcarrier to within one part in $10^{12}$ of the United States Frequency Standard (U.S.F.S.) making reference to the published offsets.

The circuitry 30 of FIG. 3 employs two phase lock loops 31 and 32 provided with divide by N dividers in the form of adjustable, and preferably binary type, digital counters.

The input 33 receives the input frequency of the network subcarrier (which is of the order of 3.58 . . . .MHz) and which is applied to a divide by A counter 34. Thus, each time the counter 34 (starting from a zero count) counts up to the quantity A, an output pulse is applied to the phase lock loop 31. Since the signal $F_{in}$ is an AC signal, a comparator 35 may be employed to compare the instantaneous AC level of the input signal against a reference level REF in order to assure precision triggering of counter 34. The comparator 35 (as well as the other comparators which may be positioned at the input of each divider neet not be employed when dividers having highly stable threshold levels are utilized.

The phase lock loop 31 compares the frequency outputs of divide by A counter 34 and divide by B counter 36 and generates an analog signal at its output 31a which is representative of the difference between the frequencies applied to its inputs. This analog level is applied to a voltage controlled oscillator 37 (which may be of the crystal type) whose output frequency is a function of the analog level applied to its input. The output of voltage controlled oscillator 37 is simultaneously applied to the input of divide by B divider 36 and to the input of divide by C divider 39. The output of divider 39 and the output of divide by D divider 40 are applied to the inputs of phase lock loop 32, which compares the frequency output signals to generate an analog level representative of the differences therebetween for controlling the voltage controlled oscillator 41 (preferably of the same type as oscillator 37) which generates an output signal $F_{out}$ which is equal to the input frequency plus (or minus) the offset.

The voltage controlled oscillators 37 and 41 are designed to generate signals whose output frequencies are nearly equal to $F_{in}$ plus or minus the appropriate adjustment necessary to obtain a balanced condition. Thus, the phase locked loop 31 is caused to generate an analog output level representative of the difference between $F_{in}/A$ and $F_{x1}/B$ so as to adjust the output of voltage controlled oscillator 37 in order to bring the value of $F_{x1}/B$ into equality with the value $F_{in}/A$.

The output frequency signal developed by voltage controlled oscillator 37 is applied to the input of the divide by C divider 39. Voltage controlled oscillator 41 has its output applied to the input of divide by D divider 40. Phase lock loop 32 is designed to provide an analog level at its output 32a which is representative of the difference between $F_{x1}/C$ and $f_{x2}/D$, which analog level causes a change in the frequency of voltage controlled oscillator 41 so as to bring the value $f_{x2}/D$ into equality with the value $f_{x1}/C$ This output signal, $f_{out}$ (where $f_{out}= f_{x2}$) is mathematically related to the input signal $f_{in}$ in accordance with the equation:

$$\frac{B}{A} \times \frac{D}{C} = \frac{F_{out}}{F_{in}}$$

The OFFSET is thus given by $$\text{OFFSET } \frac{F_{out} - F_{in}}{F_{in}} = \frac{F_{out}}{F_{in}} - \frac{F_{in}}{F_{in}}$$

If $A = C = x$; and
$B = A - 1 = x - 1$; and
$D = A + 1 = x + 1$

Then $$\frac{F_{out}}{F_{in}} = \frac{B}{A} \times \frac{D}{C} = \left(\frac{x-1}{x}\right) \times \left(\frac{x+1}{x}\right) = \frac{x^2 - 1}{x^2} \text{ ; and}$$

$$\text{OFFSET} = \frac{F_{out}}{F_{in}} - \frac{F_{in}}{F_{in}} = \frac{F_{out}}{F_{in}} - 1$$

$$= \frac{x^2 - 1}{x^2} - \frac{x^2}{x^2} = \frac{-1}{x^2}$$

Alternatively, to obtain an offset in the opposite direction, A—D may be chosen so that: $B=D=x$; $A=x-1$; $C=x+1$; so that $$\frac{F_{out}}{F_{in}} = \frac{B}{A} \times \frac{D}{C} = \frac{x^2}{x^2 - 1}.$$

Considering one example, the published offset for the East Coast CBS Television Network for the week of Jund 23-27, 1975 is $2961.9 \times 10^{-11}$. In accordance with the above equations, if:

$x = A = C = 5811$
$x + 1 = D = 5812$
$x - 1 = B = 5810$
Then OFFSET $$= \frac{-1}{x^2} = \frac{-1}{(5811)^2} = 2961.4 \times 10^{-11}.$$

Comparing this offset obtained in accordance with the principles of the present invention, against the NBS published offset, it can be seen that the difference in the output frequency $F_{out}$ is the difference between these two values resulting in an offset of only five parts in $10^{12}$.

Other values of X will approximate the offset of the other networks and this may be accomplished by setting up tables which may be used to look up the values of A-D in order to appropriately set the dividers 34, 36, 39 and 40. Some other examples for the commercial networks and the accuracy obtained through the present invention are:

| NBS Published Offsets For 23-27 June 1975 ($\times 10^{-11}$) | Value of A | ± Offset ($\times 10^{-11}$) for ckt. of Fig. 3 | Difference |
|---|---|---|---|
| CBS 2961.9 | 5811 | 2961.4 | $5 \times 10^{-12}$ |
| ABC 3008.1 | 5766 | 3007.8 | $3 \times 10^{-12}$ |
| NBC 3015.6 | 5759 | 3015.1 | $5 \times 10^{-12}$ |

The dividers in the phase lock loops may thus be digitally set for any desired offset and the regenerated color subcarrier derived, for example, from the color TV receiver will then be offset to agree with the USFS and can thus be used to control a local oscillator at various standard frequencies. The system thus provides a frequency source with an overall accuracy of about $\pm 1 \times 10^{11}$ which is available during a large portion of the day and evening at a cost of a small fraction of the cost of an atomic standard with all of the generated frequencies being directly traceable to the National Bureau of Standards.

The technique of the present invention may be utilized in a variety of applications. As per the first example given hereinabove in connection with FIG. 1, the regenerated color frequency subcarrier may be utilized as the frequency standard for calibrating and hence adjusting a local oscillator source. Thus, considering FIG. 4, the calibration of local oscillator 15 is accomplished by applying its output to offset circuitry 30 whose output is applied to the frequency synthesizer circuit 16 as a signal $F_{out}$, the circuitry 30 being shown in detail in FIG. 3. The output $F_{out}=3.58\ldots$ MHz is applied as one input to the phase comparator meter and/or recorder whose other input is derived from the regenerated subcarrier frequency from receiver 14 which, during a live program, generates a subcarrier frequency whose offset of its network standard 10 is given by the NBS published offset values. The phase recording obtained, which will be of the type shown in FIG. 2 will serve to confirm the calibration accuracy. The circuit is employed to lower the frequency of oscillator 15 to bring it into phase with the regenerated subcarrier.

Without the introduction of the electronic offset, the calibration would be off by an amount equal to the NBS published offset plus the limitation of the accuracy of the NBS measurements. In the technique of FIG. 4 nearly all of the published offset is removed from the oscillator to be calibrated with the difference between the published offset and the electronically generated offset being easily and readily determined and hence being a known amount. For example, using the ABC broadcast as the standard, the published offset is $3008.1 \times 10^{-11}$. The oscillator to be calibrated is offset by the circuitry 30 of FIG. 3 by the known amount $3007.8 \times 10^{-11}$. Thus, nearly all of the published offset is removed before calibration. Hence $3007.8 \times 10^{-11}$ is added to $-3008.1 \times 10^{-11}$ to reduce the frequency of oscillator 15 by an amount which differs from the published offset by $3 \times 10^{-12}$. Assuming the accuracy of the measurement equipment (i.e. the phase meter and/or recorder) to be ±1% then the resulting error is (1%) ($3 \times 10^{-12}$) or three parts in $10^{14}$!!

The regenerated subcarrier signal developed by the color receiver may also be employed as a frequency source whereby the regenerated subcarrier output of receiver 14 is applied to a frequency synthesizer 50 to obtain a 5 MHz frequency standard which is then offset by circuitry 30. This may be compared with a local 5 MHz oscillator for calibration purpose in accordance with the technique of FIG. 4 or, for example, may be compared by employing a second color receiver tuned to a different one of the commercial (or for that matter public) networks for calibration and adjustment thereof. Either of these may be employed as a frequency standard for applications requiring the stability of a rubidium standard and the accuracy of a cesium standard including traceability to the U.S.F.S. at a fraction of the cost. The key element of the present invention is the method by which the subcarriers of the networks and the offsets made available by NBS may be utilized to measure and/or correct the user's frequency standard or standards. Through the use of the offset generator of the present invention, rubidium standards employed by the networks provide excellent short term stability while the regularly published offsets assure the requisite long term stability otherwise available only through the use of primary atomic standards of the type maintained and operated by the National Bureau of Standards and other similar international agencies.

The technique of the subject invention may be used as a basis for adjusting cesium standards. Such standards are primary standards and are known to have offsets of the order of 1 to 2 parts in $10^{12}$, with each such primary standard having a natural tendenacy to retain its own unique offset independently aligned. By using two offset circuits of the type shown in FIG. 3 it is possible to offset the cesium standard to remove all but a small known part of the offset before performing a calibration operation upon a standard (primary or secondary) to be calibrated through the use of a cesium standard with known offset.

Considering FIG. 6:

since $F_{x2} = F_{in}$, then $\dfrac{F_{out'}}{F_{in}} = \dfrac{x^2-1}{x^2} \cdot \dfrac{x^2-1}{x^2} = \dfrac{x^4-1}{x^4}$ and offset OFF $= \dfrac{-1}{x^4 - x^2}$ where $x = 1000$ the electronic $|$offset$| = 1 \times 10^{-12}$ Where $x = 1.5 \times 10^3$ then OFF $= 1.975 \times 10^{-13}$ $x = 2 \times 10^3$ then OFF $= 6.25 \times 10^{-14}$ Where
$x = 1.5 \times 10^3$ then OFF $= 1.975 \times 10^{-13}$
$x = 2 \times 10^3$ then OFF $= 6.25 \times 10^{-14}$ The difference between the offset ($OFF_p$) for a primary source and the electronically generated offset ($OFF_{EG}$) is $OFF_p + OFF_{EG} = .2 \times 10^{116 \cdot 18} - 1 \times 10^{-12}$
$= .2 \times 10^{-12}$ or 2 parts in $10^{13}$ The $x$ values greater than 1000 may obviously be employed for offsetting the frequency of primary standards having smaller offsets than $1 \times 10^{-12}$.

Although there has been described a preferred embodiment of this novel invention, many variations and modifications will now be apparent to those skilled in the art. Therefore, this invention is to be limited, not by the specific disclosure herein, but only by the appending claims.

What is claimed is:

1. Means for adjusting the output frequency of a signal of frequency $f_{in}$ in accordance with a predetermined offset value (OFF) wherein said offset is related to a value X such that $OFF + 1 \times 10^{-11} \geq x^2 \geq OFF - 1 \times 10^{-11}$ said first means comprising means for dividing the frequency of said input by $x$;
a first voltage controlled oscillator having a control input;
means for dividing the frequency of the output of said first oscillator by $x - 1$;
means responsive to the difference in the frequency of the outputs of said first and second dividing means for generating a control signal representing said difference;
said first oscillator control input being responsive to said control signal to adjust the output frequency $f_{x1}$ of said first oscillator to bring the value $f_{x1}/(x-1)$ towards equality with the value $f_{in}/x$;
third divider means for dividing the frequency of the output of said first oscillator by $x$;
second voltage controlled oscillator means having a control input;
fourth divider means for dividing the output frequency $f_{x2}$ of said second oscillator means by $x + 1$;
means responsive to the difference in frequency of said third and fourth divider means outputs for generating a second control signal;
said second oscillator control input being responsive to said second control signal to bring said value $f_{x2}/x+1$ into equality with the value $f_{x1}/x$ whereby the frequency $f_{x2}$ of the output of said second oscillator is shifted from the frequency $f_{in}$ of said input signal by said predetermined offset to a high degree of resolution.

2. The device of claim 1 wherein each of said divider means are binary counters having means for generating an output each time the counter reaches a count representing the amount by which the input to the respective counter is to be divided.

3. The device of claim 2 wherein each counter includes means for adjusting the counter to the desired division ratio.

4. The device of claim 1 wherein each dividing means includes means for converting the input signal to the dividing means into a square wave.

5. The device of claim 4 wherein each of said converting means comprises a comparator for comparing the input signal to be converted against a predetermined threshold.

6. A method for offsetting the frequency $f_{in}$ of a high frequency signal comprising the steps of:
   a. dividing the frequency $f_{in}$ of the input signal by an amount A to obtain a signal whose frequency is $f_{in}/A$;
   b. generating a first signal whose frequency is given by $f_{x1}$;
   c. dividing said first signal to obtain a signal whose frequency is $f_{x1}/B$;
   d. determining the difference between $f_{x1}/B$ and $f_{in}/A$;
   e. adjusting the frequency $f_{x1}$ as a function of said difference to move $f_{x1}/B$ towards equality with $f_{in}/A$;
   f. dividing the frequency $f_{x1}$ of the first signal by C;
   g. generating a second signal whose frequency is $f_{x2}$;
   h. dividing the frequency of said second signal by D to obtain $f_{x2}/D$;
   i. determining the difference between $f_{x1}/C$ and $f_{x2}/D$;
   j. adjusting the frequency $f_{x2}$ as a function of said difference to move $f_{x2}/D$ towards equality with $f_{x1}/C$, whereby the frequency of said second signal is offset from said input signal in accordance with the relationship $f_{in}/f_{x2} = AC/BD$.

7. The method of claim 6 wherein $A = C$.

8. The method of claim 7 wherein $B > A$ and $D < A$.

9. The method of claim 7 wherein $B < A$ and $D > A$.

10. The method of claim 7 wherein $B = A + 1$ and $D = A - 1$.

11. The method of claim 7 wherein $B = A - 1$ and $D = A + 1$.

12. The method of claim 10 wherein the predetermined offset OFF is related to the division ratios such that $|OFF| = 1/x^2$ where $A = C = x$; $B = x - 1$; and $D = x + 1$.

13. The method of claim 10 wherein the predetermined offset OFF is related to the division ratios such that $|OFF| = 1/x^2$ where $A = C = x$; $B = x + 1$; and $D = x - 1$.

14. A method for calibrating the frequency of a local oscillator which method employs a color television receiver as a standard together with published offset data indicating the deviation of the frequency standards used by the major television networks from the frequency standard of the National Bureau of Standards comprising the steps of:
   operating the receiver to regenerate the color subcarrier of a selected one of the network broadcasts;
   offsetting the frequency of the local oscillator output in accordance with the published offset for the network program being received to convert the output signal of the local oscillator to a frequency which includes the appropriate published offset;
   converting the offset frequency of the oscillator to be calibrated to the frequency of the color subcarrier frequency;
   comparing the phase of the color subcarrier frequency regenerated by the color receiver with the aforesaid converted frequency signal and adjusting the local oscillator so that the oscillator frequency differs from the color subcarrier frequency by a fixed phase relationship.

15. A method of adjusting a local oscillator which utilizes the frequency standard of a network television signal and the published offset information for frequency calibrating purposes said information indicating the deviation of the frequency standards used by the major television networks from the frequency standard of the National Bureau of Standards comprising the steps of:
   receiving the network broadcast and regenerating the color subcarrier frequency from the received broadcast;
   offsetting the regenerated color subcarrier in accordance with the published offset data for the network standard being regenerated to bring the regenerated subcarrier into equality with the United States Frequency Standard;
   converting the frequency of said local oscillator to the frequency of said color subcarrier;
   comparing the phase of said offset color subcarrier signal with said converted signal and adjusting the local oscillator so that the compared signals are brought into a fixed phase relationship.

16. The method of claim 14 wherein the step of offsetting the frequency of the oscillator comprises:
   reducing the frequency $f_{in}$ of the oscillator by $x$ to generate a signal whose frequency if $f_{in}x$;
   comparing the frequency $f_{in}/x$ with a signal having a frequency $f_{x1}/(x-1)$ and adjusting the frequency $f_{x1}$ to that $f_{in}/x = f_{x1}/(x-1)$
   dividing the adjusted frequency $f_{x1}$ by $x$;
   comparing the frequency $f_{x1}/x$ with a signal having a frequency $f_{x2}/(x+1)$ and adjusting the frequency $f_{x2}$ so that $f_{x1}/x = f_{x2}/(x+1)$, whereby $f_{x2}$ is offset from $f_{in}$ so that $f_{x2}/f_{in} = (x^2-1)/x^2$.

17. The method of claim 16 wherein the offset OFF is given by $|OFF| = 1/x^2$ and differs from the published offset by less than one part in $10^{12}$.

18. Means for offsetting the frequency of a signal to a high degree of precision comprising:
   first means for dividing the frequency of the input signal;
   first voltage controlled oscillator means having a control input;
   second means for dividing the output of said first oscillator means;
   first phase lock up means for comparing the frequency of the outputs of said first and second dividing means and operating upon said control input to adjust the output frequency of said first oscillator means to bring the first and second dividing means outputs into phase lock;
   third means for dividing the output frequency of said first oscillator means;
   second voltage controlled oscillator means having a control input;
   fourth means for dividing the output frequency of said second oscillator means;
   second phase lock loop means for comparing the frequencies of said third and fourth dividing means outputs and operating upon the control input of said second oscillator means to adjust the frequency thereof to bring the third and fourth dividing means outputs frequencies into phase lock, whereby the output of said second oscillator means is offset from said input.

19. The offset apparatus of claim 18 wherein the input frequency of the signal to be offset is $f_{in}$;
   said first and third dividing means dividing the frequencies of their inputs by $x$ where $x$ is a real integer;
   said second and fourth dividing means respectively dividing the frequencies of their inputs by $(x + 1)$ and $(x - 1)$.

20. The offset apparatus of claim 18, wherein the input frequency of the signal to be offset is $f_{in}$;

said first and third dividing means dividing the frequencies of their inputs by $x$ where $x$ is a real integer;

said second and fourth dividing means respectively dividing the frequencies of their inputs by $(x-1)$ and $(+1)$.

21. Means for adjusting the output frequency of a signal of frequency $f_{in}$ in accordance with a predetermined offset value (OFF) wherein said offset is related to a value $x$, said first means comprising means for dividing the frequency of said input by $x \pm 1$;

a first voltage controlled oscillator having a control input;

means for dividing the frequency of the output of said first oscillator by $x$;

means responsive to the difference in the frequency of the outputs of said first and second dividing means for generating a control signal representing said difference;

said first oscillator control input being responsive to said control signal to adjust the output frequency $f_{x1}$ of said first oscillator to bring the value $f_{x1}/x$ towards equality with the value $f_{in}/(x\pm 1)$;

third divider means for dividing the frequency of the output of said first oscillator by $x \pm 1$;

second voltage controlled oscillator means having a control input;

fourth divider means for dividing the output frequency $f_{x2}$ of said second oscillator means by $x$;

means responsive to the diffeence in frequency of said third and fourth divider means outputs for generating a second control signal;

said second oscillator control input being responsive to said second control signal to bring said value $f_{x2}/x$ into equality with the value $f_{x1}/(x\pm 1)$ whereby the frequency $f$ of the output of said second oscillator is shifted from the frequency $f$ of said input signal by said predetermined offset to a high degree of resolution.

22. Apparatus for adjusting the output frequency of a signal of frequency $f_{in}$ in accordance with a predetermined offset value (OFF) wherein said offset is related to a value $x$, said apparatus comprising first and second means connected in cascase fashion, each of said first and second means comprising: means for dividing the frequency of the input thereto by $x$;

a first voltage controlled oscillator having a control input;

means for dividing the frequency of the output of said first oscillator by $x-1$;

means responsive to the difference in the frequency of the outputs of said first and second dividing means for generating a control signal representing said difference;

said first oscillator control input being responsive to said control signal to adjust the output frequency $f_{x1}$ of said first oscillator to bring the value $f_{x1}/(x-1)$ towards equality with the value $f_{in}/x$;

third divider means for dividing the frequency of the output of said first oscillator by $x$;

second voltage controlled oscillator means having a control input;

fourth divider means for dividing the output frequency $f_{x2}$ of said second oscillator means by $x+1$;

means responsive to the difference in frequency of said third and fourth divider means outputs for generating a second control signal;

said second oscillator control input being responsive to said second control signal to bring said value $f_{x2}/(x+1)$ into equality with the value $f_{x1}/x$, the output of said first means second oscillator being coupled to the input of the second means whereby the frequency $f_{x2}$ of the second means second oscillator is shifted from the frequency $f_{in}$ of said input signal by said predetermined offset to a high degree of resolution.

23. A method for offsetting the frequency $f_{in}$ of a high frequency signal comprising the steps of:

a. dividing the frequency $f_{in}$ of the input signal by an amount A to obtain a signal whose frequency is $f_{in}/A$;

b. generating a first signal whose frequency is given by $f_{x1}$;

c. dividing said first signal to obtain a signal whose frequency is $f_{x1}/B$;

d. determining the difference between $f_{x1}/B$ and $f_{in}/A$;

e. adjusting the frequency $f_{x1}$ as a function of said difference to move $f_{x1}/B$ towards equality with $f_{in}/A$;

f. dividing the frequency of $f_{x1}$ of the first signal by C;

g. generating a second signal whose frequency is $f_{x2}$;

h. dividing the frequency of said second signal by D to obtain $f_{x2}/D$;

i. determining the difference between $f_{x1}/C$ and $f_{x2}/C$;

j. adjusting the frequency $f_{x2}$ as a function of said difference to move $f_{x2}/D$ towards equality with $f_{x1}/C$, whereby the frequency of said second signal is offset from said input signal in accordance with the relationship $f_{in}/f_{x2} = AC/BD$ repeating steps (a) through (j) upon the signal of frequency $f_{x2}$ to obtain an offset output of $f_{x2}$ where $f'_{x2} = (AC/BD)^2$.

24. The method fo claim 23 wherein A=C=x; B=x±1; D=(x±1) so that $$\left| \frac{f_{in}}{f_{x2}'} \right| = \left| \frac{1}{x^4 - x^2} \right|.$$

* * * * *